(12) United States Patent
Li

(10) Patent No.: US 7,317,616 B2
(45) Date of Patent: Jan. 8, 2008

(54) MECHANISM FOR CONNECTING LOOP HEAT PIPE AND METHOD THEREFOR

(75) Inventor: Jia-Hao Li, Sindian (TW)

(73) Assignee: Jaffe Limited, Tortola, VGX ( * ) Notice: Subject to any disclaimer, the term of this patent is extended or adjusted under 35 U.S.C. 154(b) by 67 days.

(21) Appl. No.: 11/341,466

(22) Filed: Jan. 30, 2006

(65) Prior Publication Data

US 2007/0177353 A1    Aug. 2, 2007

(51) Int. Cl.
*H05K 7/20* (2006.01)

(52) U.S. Cl. ............... 361/700; 361/699; 361/701; 165/80.2; 165/80.4; 165/80.5

(58) Field of Classification Search ............... 361/688, 361/689, 699–703; 165/80.2, 80.3, 80.4, 165/185, 104.33; 62/259.2; 257/713, 714, 257/722, 723; 29/592.1, 890.03, 890.032
See application file for complete search history.

(56) References Cited

U.S. PATENT DOCUMENTS

2002/0195230 A1* 12/2002 Li ..................... 165/104.33

FOREIGN PATENT DOCUMENTS

JP    362019690 A  *  1/1987
JP    2005321143 A  *  11/2005

* cited by examiner

*Primary Examiner*—Michael Datskovskiy

(57) ABSTRACT

A mechanism for connecting a loop heat pipe and a method therefore. The mechanism can communicably connect two pipe openings of a loop heat pipe, which includes a connector body. The connector body includes at least a through hole for inserting therein at least two pipe openings. At least one of the through holes is a penetrating hole, which allows at least one unsealed pipe opening to protrude the connector body. In addition, at least a communicable hole is drilled on the connector body perpendicular to the two pipe openings, thereby communicably connecting the two pipe openings. One can access the unsealed pipe opening to clean the inner part of the pipe, so as to fill therein a working fluid. Finally, the unsealed pipe openings and the communicable hole are sealed after exhaustion. Accordingly, a loop heat pipe is obtained.

6 Claims, 5 Drawing Sheets

MECHANISM FOR CONNECTING LOOP HEAT PIPE AND METHOD THEREFOR

BACKGROUND OF THE INVENTION

The present invention relates generally to a loop heat pipe, and more particularly to a mechanism for connecting a heat pipe and a method therefore.

Modern computers have gained more and more computing power, and faster and faster operation speed. The industry has also revolutionized the way computers are made and designed. The new generation central processing unit provided the enhanced computing power. However, it also generates a huge amount of heat, which should be properly dissipated. It is important to use an efficient cooling system, such that the central processing unit can operate under a normal working temperature. Currently, a heat pipe that is highly thermal conductive, that can rapidly dissipate heat without consuming electricity, and that is light in weight, is used to satisfy the demand in electronic products.

Normally speaking, when the opening of a heat pipe is sealed, a circular disc on a processing machine is used. A plurality of clamps is disposed on the circular disc. The clamps are provided for holding and fastening the heat pipes. In addition, a plurality of work stations is disposed surrounding the edge of the circular disc. Each work station includes a sealing mechanism. The sealing mechanism includes a welding torch. The heat pipes are intermittently carried to the sealing mechanism by the rotation of the disc, which allows the torch to seal the heat pipe.

However, as shown in FIG. 1, the welding procedure requires that the welding torch to move around the edge of the heat pipe by 360 degrees. If a detachable welding torch is used, additional steps for detaching and assembling the torch is then required, which will largely slow down the production speed. Moreover, one can also use a soldering procedure instead of the welding procedure. However, the melted soldering material can flow into the pipe, which will be absorbed by the capillary structure, thereby clogging the capillary structure.

Accordingly, the inventor of the present invention realized the drawbacks in the conventional art, and developed the present invention that can overcome the drawbacks described above.

BRIEF SUMMARY OF THE INVENTION

The present invention is to provide a mechanism for connecting a loop heat pipe. The mechanism can communicably connect two pipe openings of a loop heat pipe, which includes a connector body. The connector body includes at least a through hole for inserting therein at least two pipe openings. At least one of the through holes is a penetrating hole, which allows at least one unsealed pipe opening to protrude the connector body. In addition, at least a communicable hole is drilled on the connector body perpendicular to the two pipe openings, thereby communicably connecting the two pipe openings. One can access the unsealed pipe opening to clean the inner part of the pipe, so as to fill therein a working fluid. Finally, the unsealed pipe openings and the communicable hole are sealed after exhaustion. Accordingly, a loop heat pipe is obtained.

The present invention is also to provide a method for connecting a loop heat pipe. The method includes the following steps. First, at least two through holes that allows two pipe openings on one side of a connector body to insert therein are formed. At least one of the through holes is a penetrating hole. Next, two pipe openings of a heat pipe are inserted into the through holes of the connector body, respectively. At least one of the pipe openings that protrudes the connector body is not yet sealed. Later, a communicable hole is formed in the connector body along the direction perpendicular to the two pipe openings, which allows the two pipe openings being communicably connected. Further, the crumbs remained in the communicable hole are cleaned, and the communicable hole is sealed from the outer side of the connector body. Finally, a working fluid is injected and the non-condensed gas in the heat pipe is exhausted. The unsealed pipe opening and the communicable hole are then tightly sealed. Therefore, the pipe openings of a loop heat pipe are successfully communicably connected.

DETAILED DESCRIPTION OF THE INVENTION

Figure 1:
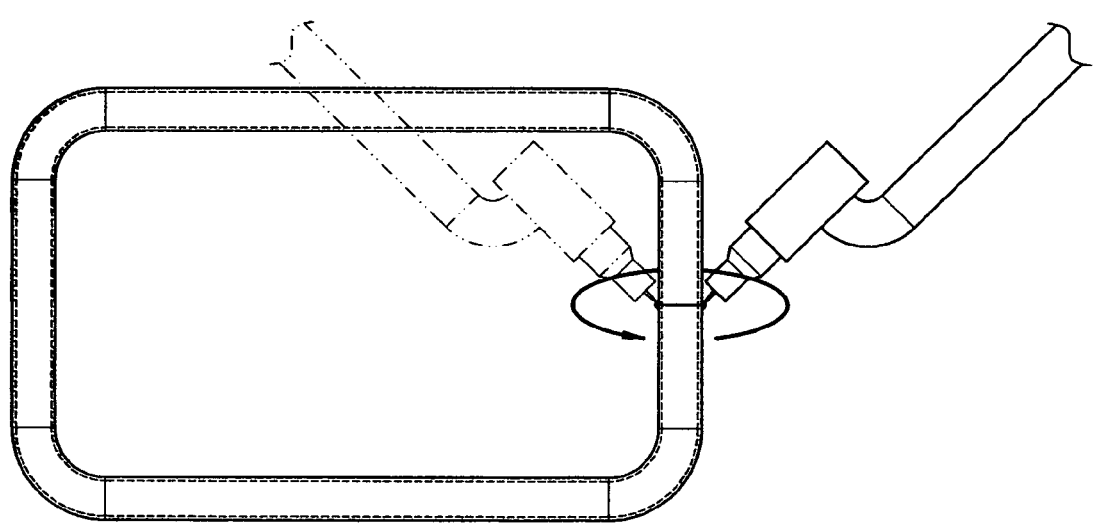
FIG. 1 illustrates a conventional sealing operation for manufacturing a loop heat pipe.

In order to better understanding the features and technical contents of the present invention, the present invention is hereinafter described in detail by incorporating with the accompanying drawings. However, the accompanying drawings are only for the convenience of illustration and description, no limitation is intended thereto.

The present invention provides a mechanism for connecting loop heat pipe and method therefore. The method includes the following steps.

a) First, at least two through holes 52, 53 that allows two pipe openings 1,2 on one side of a connector body 51 to insert therein are formed. At least one of the through holes 53 is a penetrating hole.

b) Next, two pipe openings 1,2 of a heat pipe 10 are inserted into the through holes 52, 53 of the connector body 51, respectively. At least one of the pipe openings 1 that protrudes the connector body 51 is not yet sealed.

c) Later, a communicable hole 54 is formed in the connector body 51 along the direction perpendicular to the two pipe openings 1, 2, which allow the two pipe openings 1, 2 being communicably connected.

d) Further, the crumbs remained in the communicable hole 54 are cleaned, and the communicable hole 54 is sealed from the outer side of the connector body 51.

e) Finally, a working fluid is injected and the non-condensed gas in the heat pipe is exhausted. The unsealed pipe opening 1 and the communicable hole 54 are then tightly sealed. Therefore, the pipe openings 1, 2 of a loop heat pipe 10 are successfully communicably connected.

In addition, the step b) described above can further include a step of gluing the heat pipe 10 and the connector body 51 via an adhesive. Alternatively, a melted soldering material can flow into the gap between the two pipe openings 1, 2 and the through hole 53. The melted soldering material will be solidified after being cooled. Furthermore, one can pseudo seal the unsealed pipe opening 1 first in step b) and open the pipe opening 1 during the exhaustion of step e).

Figure 2:
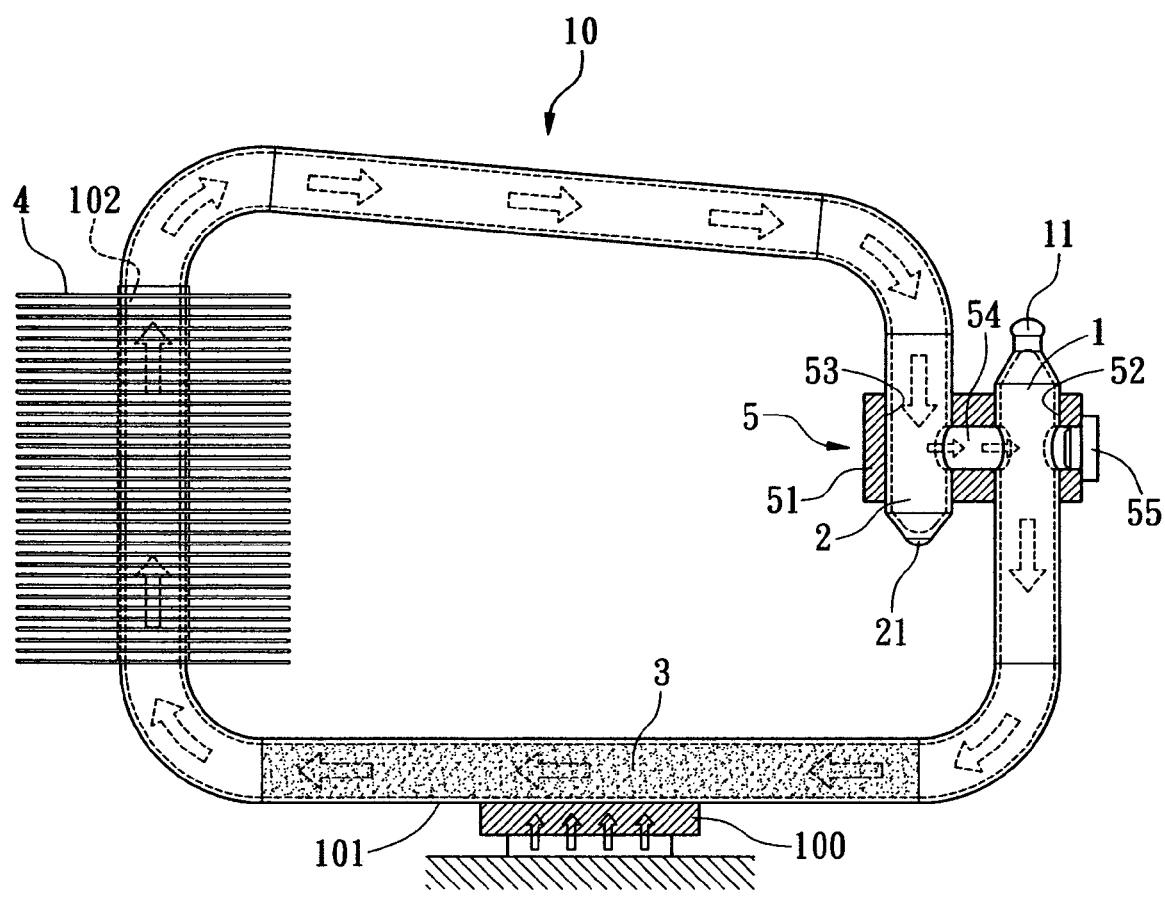
FIG. 2 illustrates a loop heat pipe of the present invention.

In order those of ordinary skill in the art to better understanding the feature of the present invention, one particular embodiment is hereinafter described by incorporating with the accompanying drawings. Referring to FIG. 2, the two pipe openings 1, 2 of a loop heat pipe are communicably connected according to the present invention. The loop heat pipe 10 includes a working fluid or a capillary structure 3 disposed therein. In addition, the loop heat pipe 10 also includes a heat reception end 101 and a condensation end 102. The heat reception end 101 is adhered to a heat source 100, such as a central processing unit (CPU), which conducts the heat generated from the heat source 100 to the heat reception end 101 of the heat pipe 10. By performing a heat exchange process through the working fluid 3 and the capillary structure, the temperature of the working fluid will be increased, which can transfer the working fluid to the condensation end 102 for further heat exchange.

The condensation end 102 of the heat pipe 10 is composed of a plurality of cooling fins 4. The working fluid of high temperature performs further heat exchange with the cooling fins 4. The working fluid is then condensed and flowed back to the heat reception end 101.

In order for the heat pipe 10 to dispose the working fluid or the capillary structure 3 and to form circulation, at least one of the two pipe openings 1, 2 must be unsealed. After the working fluid or the capillary structure 3 is disposed, the two pipe openings 1, 2 are communicably connected. The feature of the present invention is in that a connection mechanism 5 is employed to allow communicable connection between the two pipe openings 1, 2.

Figure 3:
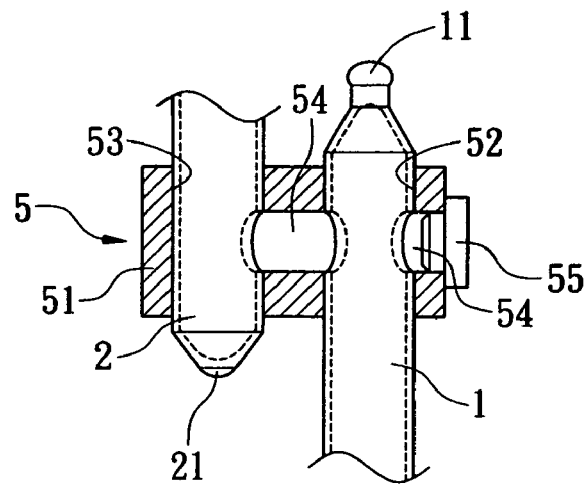
FIG. 3 is a sectional view illustrating two pipe openings that are penetrated through the connector body, in accordance with the first embodiment of the present invention.
Figure 4:
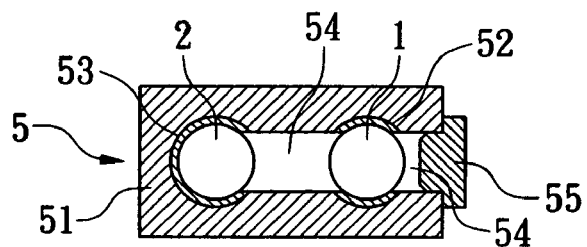
FIG. 4 is a sectional view illustrating two pipe openings that are penetrated through the connector body, in accordance with another viewing angle of FIG. 3.

Referring to FIG. 3 and FIG. 4, the connection mechanism 5 includes a connector body 51. Two through holes 52, 53 are formed on one side of the connector body 51 allowing at least two pipe openings 1, 2 to insert therein. In the first embodiment of the present invention, the two through holes 52, 53 penetrates the connector body 51, thereby allowing the two pipe openings 1, 2 to penetrate the two through holes 52, 53 of the connector body 51, respectively, with the top end of one pipe opening 1 being unsealed. At least a communicable hole 54 is drilled on the connector body 51 along the direction perpendicular to the two pipe openings 1, 2. The communicable hole 54 is extended to the side surfaces of the two pipe openings 1, 2, thereby allowing the two pipe openings 1, 2 to be communicably connected. Therefore, the heat pipe 10 forms a circulating loop.

After the heat pipe is cleaned by accessing the top end 11 of the unsealed pipe opening 1, disposed with working fluid and capillary structure 3, and evacuated, the unsealed top end 11 and the communicable hole 54 of the connector body 51 are then tightly sealed. In this particular embodiment, the top end 11 of the unsealed pipe opening 1 is sealed by soldering. The communicable hole 54 is blocked by a plug 55. In this manner, the two pipe openings 1, 2 are communicably connected via the connection mechanism of the present invention, thereby forming a tightly sealed circulating loop heat pipe 10.

Figure 5:
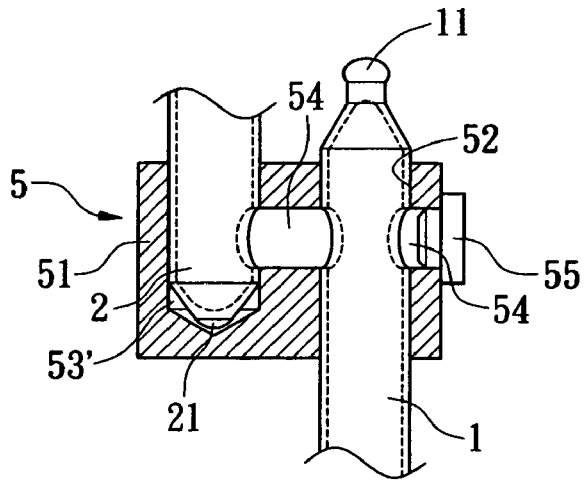
FIG. 5 is a sectional view illustrating two pipe openings that are penetrated through the connector body, in accordance with the second embodiment of the present invention.

Referring to FIG. 5, the connection mechanism in accordance with the second embodiment of the present invention is illustrated. As shown, at least one of the two through holes 52, 53 formed on the connector body 51 penetrates the connector body 51, while the other through hole is a blind hole, which does not penetrate the connector body 51.

Figure 6:
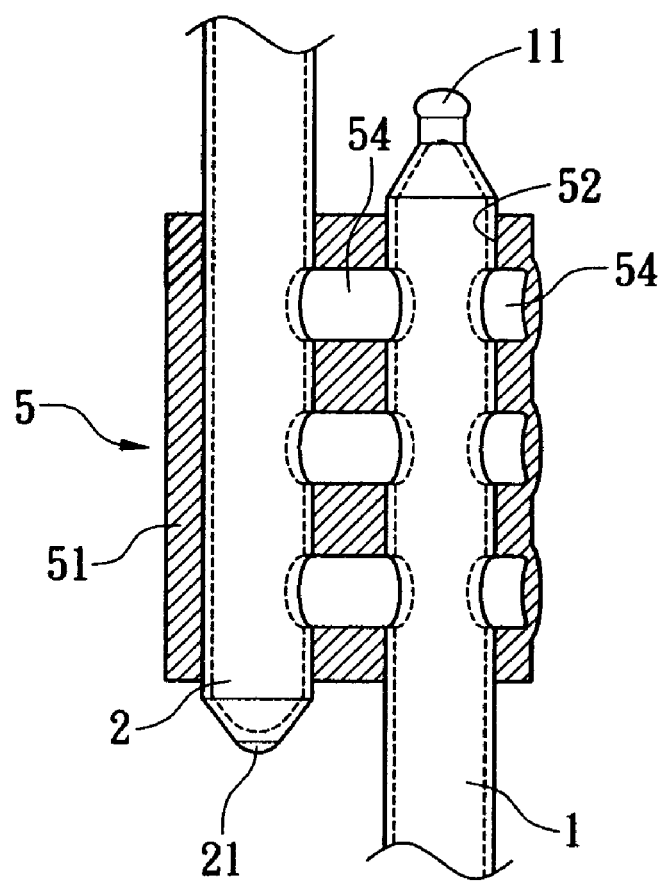
FIG. 6 is a sectional view illustrating two pipe openings that are penetrated through the connector body, in accordance with the third embodiment of the present invention.
Figure 7:
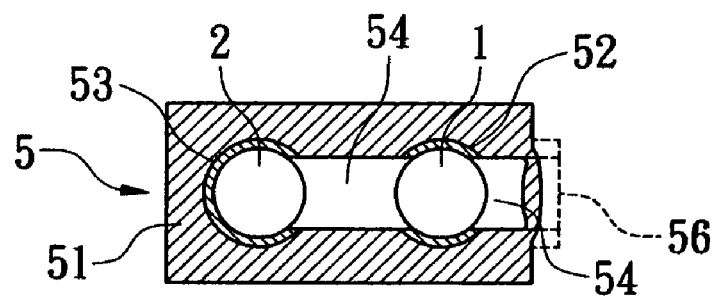
FIG. 7 is a sectional view illustrating two pipe openings that are penetrated through the connector body, in accordance with the fourth embodiment of the present invention.

Referring to FIG. 6, the connection mechanism in accordance with the third embodiment of the present invention is illustrated. In addition to drilling a communicable hole 54 on the connector body 51 along the direction perpendicular to the two pipe openings 1, 2, one can also drill a plurality of communicable holes 54, which enables a more convenient and quicker way to clean the heat pipe, or to dispose the working fluid and the capillary structure 3. Referring also to FIG. 7, the connection mechanism in accordance with the fourth embodiment of the present invention is illustrated. In addition to blocking the communicable hole 54 by using a plug 55, one can also use a melted metallic material 56 to fill and seal the communicable hole 54. The metallic material 56 is one part of the connector body 51.

Figure 8:
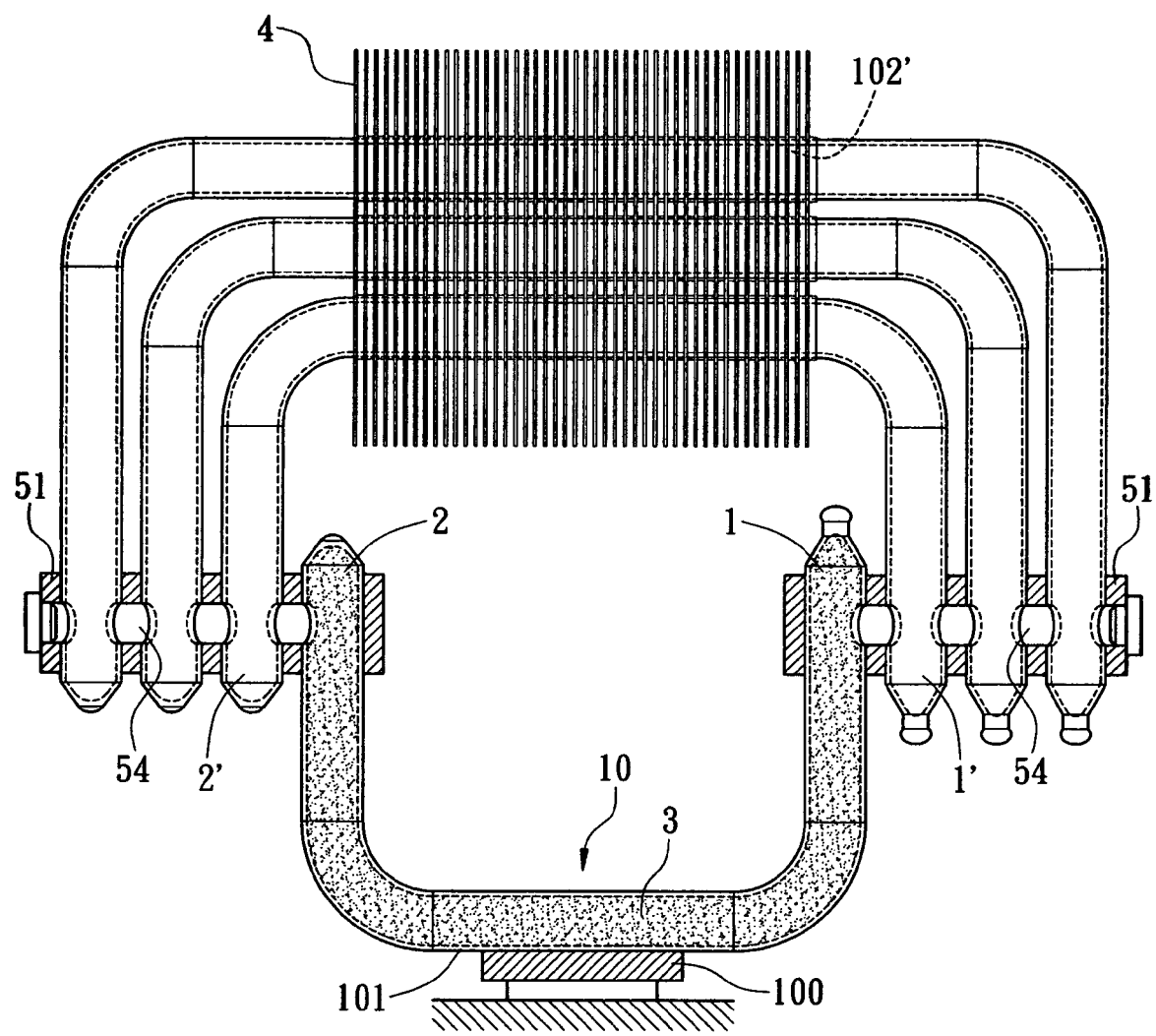
FIG. 8 is a sectional view illustrating two pipe openings that are penetrated through the connector body, in accordance with the fifth embodiment of the present invention.

Referring to FIG. 8, the connection mechanism in accordance with the fifth embodiment of the present invention is illustrated. As shown, the connection mechanism 5 can be used to connect a plurality of heat pipes 10, 10' with each other. One heat pipe 10 of U-shape includes a heat reception end 101. The two end pipe openings 1, 2 are inserted into a connector body 51. In addition, two pipe openings 1', 2' of a heat pipe 10' having a condensation end 102' are inserted to connector body 51. The heat pipe 10' includes a plurality of cooling fins 4 disposed thereon A communicable hole 54 is drilled on the connector body 51, thereby communicably connecting the heat pipe 10 having the heat reception end 101 and the heat pipe 10' having the condensation end 102'. Since a plurality of heat pipes 10' having a condensation end 102' are used, the heat dissipation rate is significantly enhanced.

According to the description set forth above, the connection mechanism 5 of the present invention can easily and rapidly communicably connect the two pipe openings 1, 2 of a loop heat pipe. This connection mechanism 5 can also increase the production yield of the heat pipes 10. Meanwhile, the heat exchange of the heat pipe 10 is accelerated, giving rise to a better cooling rate.

In summary, the mechanism for connecting a loop heat pipe and a method therefore of the present invention can indeed satisfy the patentability requirements of the patent law, a grant of letters patent therefore is thus respectfully requested.

Since, any person having ordinary skill in the art may readily find various equivalent alterations or modifications in light of the features as disclosed above, it is appreciated that the scope of the present invention is defined in the following claims. Therefore, all such equivalent alterations or modifications without departing from the subject matter as set forth in the following claims is considered within the spirit and scope of the present invention.

What is claimed is:

1. A mechanism for connecting a loop heat pipe, which includes at least a connection mechanism to communicably connecting two pipe openings of the loop heat pipe, wherein the connection mechanism includes a connector body, the connector body including a through hole for inserting therein at least two pipe openings, at least a communicable hole formed on the connector body perpendicular to the two pipe openings, thereby communicably connecting the two pipe openings and making the heat pipe to form a closed loop, wherein the communicable hole of the connector body will be sealed, and wherein a heat pipe of U-shape having a heat reception end is disposed, the pipe openings of the heat pipe being inserted to the through hole of the connector body, a heat pipe have a condensation end being inserted to the through hole, a communicable hole being formed on the connector body, thereby communicably connecting the heat pipe having a heat reception end and the heat pipe having a condensation end.

2. The mechanism as recited in claim 1, wherein the heat pipe having a condensation end includes a plurality of cooling fins disposed thereon.

3. The mechanism as recited in claim 1, wherein the communicable hole is tightly sealed by a plug at one side surface of the connector body.

4. The mechanism as recited in claim 1, wherein the communicable hole is tightly sealed by a melted metallic material at one side surface of the connector body.

5. The mechanism as recited in claim 4, wherein the metallic material is integral part of the connector body.

6. The mechanism as recited in claim 1, wherein at least one of the through holes penetrates the connector body, while the other through hole is a blind hole which does not penetrate the connector body.

* * * * *